United States Patent [19]  [11] 4,261,792
Tsuji et al.  [45] Apr. 14, 1981

[54] METHOD FOR FABRICATION OF SEMICONDUCTOR DEVICES

[75] Inventors: Kazuhiko Tsuji, Katano; Takashi Ohzone; Shigetoshi Takayanagi, both of Kyoto, all of Japan

[73] Assignee: Matsushita Electric Industrial Co., Ltd., Osaka, Japan

[21] Appl. No.: 932,194

[22] Filed: Aug. 9, 1978

Related U.S. Application Data

[63] Continuation of Ser. No. 794,070, May 5, 1977, abandoned.

[30] Foreign Application Priority Data

May 11, 1976 [JP] Japan .................................. 51-54051

[51] Int. Cl.³ ......................................... H01L 21/308
[52] U.S. Cl. ..................................... 156/656; 156/657; 156/659.1; 156/665; 204/325; 204/38 A; 204/58; 430/314; 430/315

[58] Field of Search ............... 156/628, 632, 634, 656, 156/657, 659.1, 661, 643, 904, 665; 96/27 E, 36.1, 35.1; 204/38 A, 325, 58; 430/314, 315

[56] References Cited

U.S. PATENT DOCUMENTS

| | | | |
|---|---|---|---|
| 3,576,630 | 4/1971 | Yanagawa | 156/659 |
| 3,796,644 | 3/1974 | Bernard | 204/58 |
| 3,808,108 | 4/1974 | Herb et al. | 204/325 |
| 3,825,454 | 7/1974 | Kikuchi et al. | 156/656 |
| 3,833,434 | 9/1974 | Kikuchi et al. | 156/656 |
| 3,991,231 | 11/1976 | Trausch | 156/656 |
| 4,035,206 | 7/1977 | Rioult et al. | 156/628 |

Primary Examiner—Jerome W. Massie
Attorney, Agent, or Firm—Burgess, Ryan and Wayne

[57] ABSTRACT

A metallization or conductor or semiconductor layer formed over one major surface of a semiconductor wafer subjected to anodizing to form an anodized coating which has excellent adherence to the conductor or semiconductor layer and which is used as an etching mask when the conductor or semiconductor layer is etched.

3 Claims, 17 Drawing Figures

METHOD FOR FABRICATION OF SEMICONDUCTOR DEVICES

This is a continuation, of application Ser. No. 794,070, filed May 5, 1977, now abandoned.

BACKGROUND OF THE INVENTION

The present invention relates generally to a method for fabrication of semiconductor devices and more particularly a method for forming extremely fine patterns of the semiconductor devices.

In the metallization for intraconnections of semiconductor devices, the necessity for forming extremely fine patterns becomes increasingly important in the fabrication of high density integrated circuits. In general, evaporated films of aluminum have been used for metallization, but they produce various problems when etched to form extremely fine patterns. The so-called wet chemical etching methods employed in etching the aluminum films or layers are advantageous in that mass production is possible and the apparatus is simple to build, but these methods are not adoptable to form extremely fine patterns. When the aluminum layers are etched, they are coated in general with positive and negative photoresists. The negative photoresist coatings are excellent in adherance to the aluminum layers and in resistance to chemicals, but their resolution is not satisfactory and the formation of bridges tends to occur very frequently so that they cannot be used in forming extremely fine patterns wherein structual features are spaced apart from each other by a distance less than four microns.

SUMMARY OF THE INVENTION

One of the objects of the present invention is to provide a method for fabrication of semiconductor devices having extremely fine patterns.

Another object of the present invention is to provide a method for forming extremely fine patterns very faithful to a photomask by using as an etching mask an anodized coating pattern similar to that of the photomask.

A further object of the present invention is to provide a method for fabrication of semiconductor devices which substantially solves the problems caused by a poor bond between a photoresist film and a conductor layer by the use of an anodized coating which may be used as an etching mask when the conductor layer is photoengraved, whereby a desired intraconnection or interconnection pattern may be formed with an extremely higher degree of dimensional accuracy.

To the above and other ends, the present invention provides a method for fabrication of semiconductor devices characterized by the steps of forming over one major surface of a semiconductor wafer a conductor layer of a metal, an alloy or a semiconductor capable of anodic oxidation, anodizing said conductor layer to form a thin anodized coating over the whole surface of the conductor layer, setting a photoresist mask over the anodized coating and etching it to form an anodized coating pattern or mask, and etching said conductor layer through said anodized coating pattern or mask.

The above and other effects, features and advantages of the present invention will become more apparent from the following description of the invention in conjunction with the accompanying drawings.

BRIEF DESCRIPTION OF THE DRAWINGS

Same reference numerals are used to designate similar parts throughout the figures.

DESCRIPTION OF THE PREFERRED EMBODIMENTS

Prior Art, FIG. 1

Figure 1A:
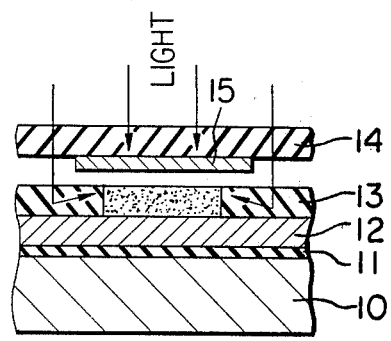
FIGS. 1(a) through 1(d) are views used for the explanation of the steps of prior art method for metallization.
Figure 2A:
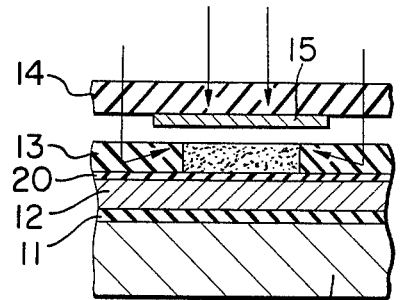
FIGS. 2(a) through 2(d) are views used for the explanation of a method in accordance with the present invention.
Figure 1B:
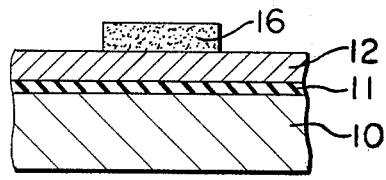
Figure 2B:
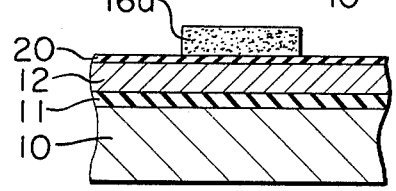
Figure 1C:
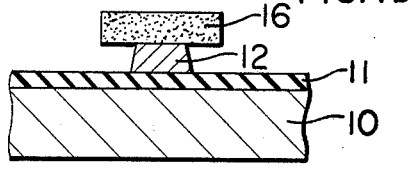
Figure 1D:
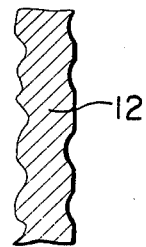

In order to distinctly and specifically point out the problems of the prior art which the present invention has solved, a typical example of the prior art methods for forming contact and intraconnection metallization will be described briefly with reference to FIG. 1. A semiconductor layer 10 has a thin oxide or $SiO_2$ layer 11 which is in turn coated with a thin layer 12 of metal or semiconductor to be referred to as "a conductive layer" in this specification. The conductive layer 12 is coated with a positive photoresist film 13 (which may be for instance AZ1350J, a product of Sipley Co.), and the photoresist film 13 is exposed through a mask 14 in the manner well known in the art. However as shown in FIG. 1(a) because of the diffusion of light an unexposed area of the photoresist film 13 tends to become smaller than a dark area 15 of the mask 14. Next the photoresist film 13 is developed to remove the exposed regions so that a photoresist film or pattern 16 remains at the unexposed region as shown in FIG. 1(b) and is used as a resist pattern in the step of etching the conductor or metallization layer 12. However because of a poor bond between the resist pattern 16 and the conductor layer 12, the etchant penetrates into both of them with the resultant over-undercut as shown in FIG. 1(c). As a consequence, the remaining conductor layer or metallization is smaller or narrower than the resist pattern 16 and has irregularly corroded or attacked edges to be referred to as "being chipped" in this specification when viewed from the above as shown in FIG. 1(d). The over-undercutting and the "chipping" are all caused by the over-etching due to a poor bond between the resist pattern 16 and the conductor layer 12.

For instance, with the photoresist pattern 16 (AZ1350J) one micron in thickness and the conductor layer of aluminum one micron in thickness, it is extremely difficult to faithfully reproduce the dark area 15 three microns in width of the mask 14. As described above the prior art methods cannot form extremely fine patterns of integrated circuits.

First Embodiment, FIG. 2

Figure 2C:
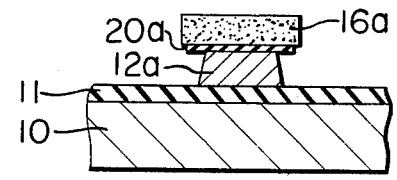

Next referring to FIG. 2 the first embodiment of the present invention will be described. A first step is to form a conductor layer 12 of metal or semiconductor capable of anodic oxidation over an oxide or $SiO_2$ layer 11 which in turn is grown over the major surface of the semiconductor or silicon wafer 10. A second step is to subject the conductor layer 12 to anodizing to form an anodized coating 20. A third step is to coat the anodized coating 20 with the photoresist film 13 and a fourth step is to expose it through the mask 14 as in the prior art methods. After the development, the remaining film 16 a is used as a resist pattern in the step of etching the anodized film 20 as shown in FIG. 2(c). The remaining anodized coating 20a is used as a resist pattern or mask in the step of etching the conductor layer 12 as shown in FIG. 2(c).

Figure 2D:
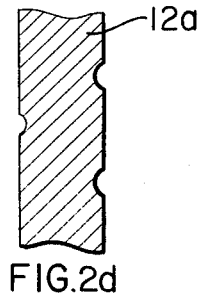

The anodized coating 20 is formed by anodizing the conductor layer 12, so that an excellent bond between the anodized coating 20 and the conductor layer 12 results, so adherence is by far superior to that between the photoresist film 16a and the conductor layer 12. As a result, the overetching may be substantially eliminated and the remaining conductor layer 12a or contact or intraconnection metallization may have straight edges which are less corroded as shown in FIG. 2(d).

In the etching step shown in FIG. 2(c) the photoresist film 16a may be stripped or left. The thickness of the anodized coating 20 must be carefully selected because when the anodized coating 20 is too thin, both the conductor layer 12 and the anodized coating pattern or mask 20a are simultaneously etched with the resultant deformation of the latter. Therefore it is preferable to leave the photoresist film 16a to solve the above problem. However when the anodized coating 20a is sufficiently thick, it is preferable to strip off the photoresist mask 16a prior to the etching step.

EXAMPLE 1

An aluminum layer for intraconnection one micron in thickness was formed on the oxide or $SiO_2$ layer 11 grown over the silicon semiconductor wafer 10. Thereafter the wafer was immersed in 15% by weight solution of ammonium pentaborate in ethylene glycol and a constant current at 10 volts was used to form the $Al_2O_3$ coating 20 about 150 Å over the whole surface of the aluminum layer 12. Thereafter the positive photoresist film 16 (AZ1350J) was coated over the $Al_2O_3$ coating 20 and was exposed through the mask 14. After the development the photoresist pattern 16a remained and was used as a mask for etching the $Al_2O_3$ coating 20 and the Al layer 12 with an etchant consisting of ($H_3PO_4$+$HNO_3$+$CH_3COOH$). The aluminum metallization pattern or strips 12a three microns in width and spaced apart from each other by three microns were easily formed irrespective of the surface irregularity of the wafer. The intraconnection metallization had edges "chipped" as shown in FIG. 2(d) when the $Al_2O_3$ coating 20 was etched with the photoresist pattern or mask 16a, but as compared with the intraconnection metallization pattern shown in FIG. 1(d) the edges are by far straight or regular.

The method described above may be also used in providing contacts of CCD. That is, after the step shown in FIG. 2(c), the side surfaces of the aluminum pattern 12a are further subjected to anodizing and thereafter an aluminum layer is formed by vacuum evaporation. Next the photoresist pattern 16a is removed so that a gate electrode or contact isolated by the side $Al_2O_3$ coating from the Al pattern 12a may be formed adjacent $SiO_2$ layer 11. For instance, the width of the contact thus formed is two microns and the contacts are spaced apart from each other by 0.1 micron.

When an anodizing voltage is increased so that a thick $Al_2O_3$ coating 20 is formed, an etchant consisting of $CrO_3$, $H_3PO_4$ and $H_2O$ is used at 80° C. for etching the $Al_2O_3$ coating 20. After etching the photoresist pattern 16a is stripped, and the etchant consisting of ($H_3PO_4$+$HNO_3$+$CH_3COOH$) is used to etch the Al layer to form the Al pattern 12a. In this case, the $Al_2O_3$ coating is also subjected to etching, but the etching rate of this coating is about 1/50 of the etching rate of the Al layer so that no problem arises.

Instead of the Al conductor layer 12, the conductor layer consisting of an alloy such as Al-Si or Al-Cu may be formed. When Ta or Ti is used to form the conductive layer 12, Ta may be anodized in $H_3PO_4$ solution while Ti, in borax in ethylene glycol. In addition, the semiconductors such as Si, GaAs, $GaP_xAs_{1-x}$, $Ga_{1-y}In_y$ and so on may be used to form the conductor layer 12, and $KNO_3$ in ethylene glycol or ($H_2O_2$+$NH_4OH$) solution may be used when they are anodized. Furthermore the method described above may be equally applied when no oxide layer 11 is grown over the wafer 10.

Second Embodiment, FIG. 3

Following the procedure of First Embodiment described above, the conductor layer 12 capable of anodic oxidation is formed over the oxide layer 11 grown over the wafer 10, and the photoresist coating 13 is formed over the conductor layer 13 and exposed through the mask 14. After development the photoresist pattern 16b remains and is used as a mask in the step of anodizing the conductor layer 12 to form an anodized coating 20b. In anodizing 15% by weight solution of ammonium pentaborate ($NH_4B_5O_8$. 4 $H_2O$) in ethylene glycol is used as an electrolyte because this solution contains less water so that the penetration into the interface between the photoresist pattern 16b and the conductor layer 12 may be minimized even though the bond there between is poor and consequently the anodized coating 20b may be as faithfully reproduced as the aperture defined by the photoresist pattern 16b.

Next the photoresist pattern 16b is stripped and the anodized coating 20b is used as a mask in the step of etching the conductor layer 12. As described above the coating 20b is formed by anodizing the conductor layer 12 so that an excellent bond between them results. As a result the anodized coating 20b is undercut as much as the Al layer 12 so that the intraconnection metallization pattern 12b may have straight edges as shown in FIG. 3(d) opposed to one formed only with the photoresist pattern 16b.

The second method described above may be equally applied to the conductor layer 12 consisting of Al, aluminum alloys, Ta, Ti and other metals and semiconductors such as Si, GaAs, $GaP_xAs_{1-x}$, $Ga_{1-y}In_yAs$ and so on.

EXAMPLE 2

Following the procedure of EXAMPLE 1 a wafer 10 with an oxide layer 11, a conductor layer 12 and a photoresist coating 13 was prepared and exposed through the mask 14 and developed to form the resist pattern 16b. Following still the procedure of EXAMPLE 1 the conductor layer 12 was subjected to anodizing at a constant voltage 50 V at room temperature in the same electrolyte to form the $Al_2O_3$ pattern 20b. Thereafter the resist pattern 16b was removed with a solution (J-100) and the Al layer 12 was etched with an etchant ($H_3PO_4+HNO_3+CH_3COOH$: at 60° C.). As described above the etching rate of the $Al_2O_3$ pattern was about 1/50 of the etching rate of the Al layer 12. Thereafter the $Al_2O_3$ pattern 20b was removed with an etchant ($CrO_3+H_3PO_4$: at 80° C.) so that only the Al pattern 12b remained.

As described above the $Al_2O_3$ pattern is sufficiently resistant to the etchant of the Al layer so that the masking effect is excellent and consequently the isotropical etching of the Al layer 12 results. In addition the undercut of the Al pattern 12b is equal to the thickness thereof, and the edge of the Al pattern 12b represents an arc of a circle whose center is at the edge of the $Al_2O_3$ pattern 20b. The "chipping" of the edges of the Al pattern 12b is less. Therefore once the thickness of the Al layer 12 is determined, the Al pattern 12b with a higher degree of dimensional accuracy may be formed. For instance, in EXAMPLE 2 with the Al layer 12, the Al pattern 12b having an accurate width of two microns was formed.

Figure 3A:
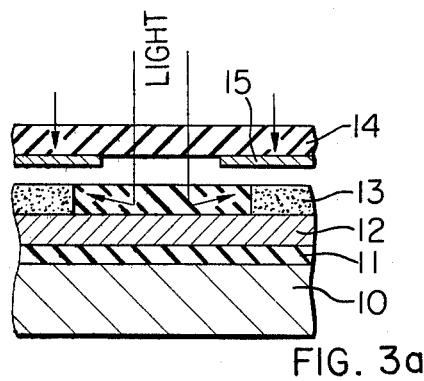
FIGS. 3(a) through 3(d) are views used for the explanation of another method in accordance with the present invention.
Figure 3B:
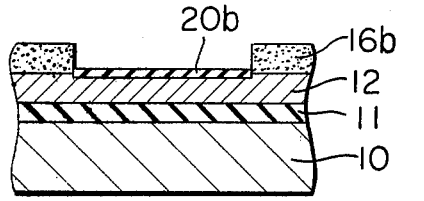
Figure 3C:
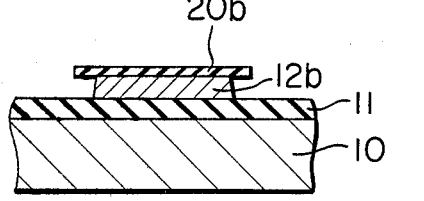
Figure 3D:
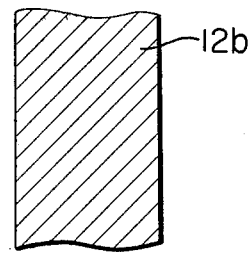

As with the prior art, the photoresist pattern 16b becomes small than the dark area 15 of the photomask 14 due to the diffusion of light so that the increase in diameter of the aperture results as shown in FIG. 3(a). However, as best shown in FIG. 3(c) the undercut of the Al pattern 12b is equal to the thickness of the Al layer 12 so that the increase in diameter of the aperture and hence the $Al_2O_3$ pattern 20b is cancelled by the undercut of the Al pattern 12b and consequently the Al pattern 12b has the dimensions and is spaced apart from each other as designed. Since the increase in diameter of the aperture or the $Al_2O_3$ pattern 20b may be controlled precisely by controlling the exposure conditions, the undercut may be controlled precisely as described above so that the Al pattern 12b faithful to the mask 14 may be formed. The Al pattern 12b may be used for instance as a mask when the $SiO_2$ layer 11 or the wafer 10 is etched in a plasma atmosphere of $CF_4$.

Figure 4A:
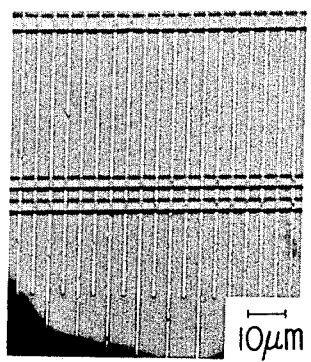
FIG. 4(a) shows an photomicrograph of an intraconnection pattern formed by the prior method shown in FIG. 1.
Figure 4B:
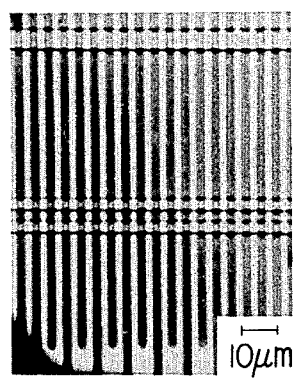
FIG. 4(b) is an photomicrograph of an intra-connection pattern formed by the method shown in FIG. 3.

In FIGS. 4(a) and 4(b) there are shown photomicrographs of the Al patterns formed by the prior art chemical etching method and by the second method in accordance with the present invention, respectively. The white areas in the micrographs indicate the Al patterns. It is seen from FIG. 4(a) that the Al metallization pattern is so narrow that it is easily susceptible to disconnection. Furthermore it is "chipped" at various points. On the other hand, it is seen from FIG. 4(b) that the Al pattern formed in accordance with the present invention is very faithful to the mask pattern.

Figure 5A:
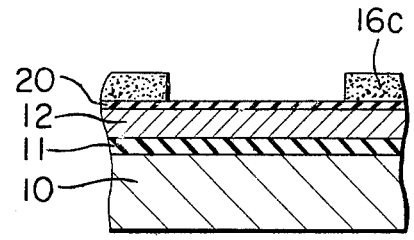
FIGS. 5(a) through 5(c) are views used for the explanation of a further method in accordance with the present invention.

Third Embodiment, FIG. 5

Figure 5B:
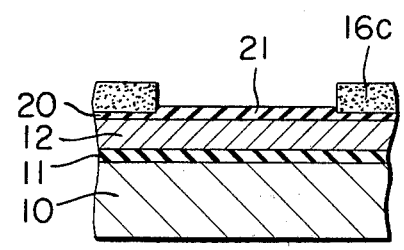
Figure 5C:
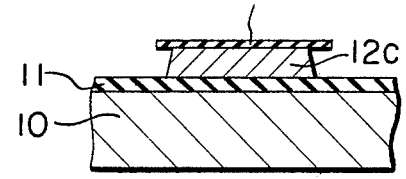

Next referring to FIG. 5 the third embodiment or method in accordance with the present invention will be described. It consists of the combination of the first and second embodiments or methods described above. That is, the conductor layer 12 is formed over the oxide layer 11 over the wafer 10, and the conductor layer 12 is anodized following the procedure described above in conjunction with FIG. 2 to form an anodized coating 20. Next following the procedure described above in conjunction with FIG. 3, the photoresist pattern 16c is formed and is used as a mask when the anodized coating 20 is further anodized to form a second anodized coating 21 as shown in FIG. 5(b), the thickness of the second coating 21 being greater than that of the first coating 20. Next the photoresist pattern 16c is removed and the lamination of the first and second anodized coatings 20 and 21 is used as a mask in the step of etching the conductor layer 12 and the Al pattern 12c is formed as shown in FIG. 5(c).

In summary, according to the present invention the anodized coating of the conductor layer is used as a mask when the latter is etched. Therefore the mask and the conductor layer to be etched are integral and have an excellent bond so that the undercut may be minimized in the etching step and consequently the precise metallization pattern may be formed. The dimensional accuracy may be considerably increased so that an extremely fine pattern having a width and spacing both less than two microns may be formed with a higher degree of dimensional accuracy. Thus the present invention is very advantageous in the fabrication of high density integrated circuits.

What is claimed is:

1. A method for forming an etched pattern in fabricating semiconductor devices which comprises:
    (a) forming over a semiconductor substrate, a conductor layer of a metal, metal alloy or semiconductor layer capable of anodic oxidation;
    (b) forming a positive type photoresist pattern having an opening portion wider than a dimension of a light transmitting portion of a photomask, by forming over said conductor layer said positive type photoresist layer and by developing said photoresist layer after selectively exposing said photoresist layer by said photomask;
    (c) forming over said conductor layer of said opening portion, an etching mask comprising an anodic oxidation pattern defined by said photoresist pattern and anodically oxidized in a solution of ammonium pentaborate in ethylene glycol;
    (d) removing said photoresist pattern;
    (e) selectively etching said conductor layer through said etching mask with a solution and leaving the conductor layer pattern masked with said etching mask, whereby a conductor layer pattern faithfully corresponding to the photomask pattern may be formed, said conductor layer pattern comprising an electrode for a semiconductor region disposed in said substrate under said conductor layer pattern.

2. A method as set forth in claim 1 which further comprises:
    (a) forming over an entire surface of said conductor layer, a thin anodic oxidation layer before forming said positive type photoresist layer;
    (b) forming an anodic oxidation pattern having a thickness thicker than said thin anodic oxidation over said opening portion of the mask of said photoresist pattern; and
    (c) etching said thin anodic oxidation layer and said conductor layer by the mask of said thick anodic oxidation pattern.

3. The method of claim 1 wherein the metal of the conductor layer is aluminum.

* * * * *